(12) United States Patent
Lenhardt

(10) Patent No.: US 7,412,844 B2
(45) Date of Patent: Aug. 19, 2008

(54) METHOD AND APPARATUS FOR COOLING SEMICONDUCTOR CHIPS

(75) Inventor: Ronald Robert James Lenhardt, Vaughan (CA)

(73) Assignee: Blue Zone 40 Inc., Toronto (CA)

(*) Notice: Subject to any disclaimer, the term of this patent is extended or adjusted under 35 U.S.C. 154(b) by 358 days.

(21) Appl. No.: 11/368,523

(22) Filed: Mar. 7, 2006

(65) Prior Publication Data
US 2007/0209379 A1 Sep. 13, 2007

(51) Int. Cl.
F25B 39/02 (2006.01)
(52) U.S. Cl. .................. 62/259.2; 62/515
(58) Field of Classification Search ............ 62/259.2, 62/515; 361/696, 699, 701
See application file for complete search history.

(56) References Cited

U.S. PATENT DOCUMENTS

| | | | |
|---|---|---|---|
| 5,323,847 A * | 6/1994 | Koizumi et al. | 165/104.33 |
| 5,345,107 A | 9/1994 | Daikoku et al. | |
| 5,539,155 A | 7/1996 | Kunieda et al. | |
| 5,574,627 A | 11/1996 | Porter | |
| 6,205,796 B1 * | 3/2001 | Chu et al. | 62/94 |
| 6,679,315 B2 | 1/2004 | Cosley et al. | |
| 6,687,125 B2 | 2/2004 | Park et al. | |
| 2004/0104468 A1 | 6/2004 | Suzuki et al. | |

FOREIGN PATENT DOCUMENTS

| | | |
|---|---|---|
| EP | 0 489 326 A2 | 6/1992 |
| JP | 2005-093969 | 4/2005 |
| WO | WO 01/25881 A2 | 4/2001 |
| WO | 03010646 A1 | 2/2003 |
| WO | WO 2005/045654 A2 | 5/2005 |

OTHER PUBLICATIONS

Internet advertising. "Vapochill". Retrieved Feb. 2006, from http://www.asetek.com.

* cited by examiner

*Primary Examiner*—Melvin Jones
(74) *Attorney, Agent, or Firm*—Bereskin & Parr

(57) ABSTRACT

A cooling apparatus for cooling a heat-generating chip mounted in a socket on a circuit board, the socket including a cradle having a standard heat-sink receiving configuration, includes an evaporator having a thermally conductive front face, a compressor in fluid communication with the evaporator for delivering refrigerant thereto, and an evaporator mount for coupling the evaporator to the heat-generating chip with the front face adjacent thereto. The mount includes a housing having coupling elements for connection to the cradle. The housing has an interior in which a housing insulation pack is provided for retaining the evaporator therein. The mount further includes a cradle insulation pack for maintaining the socket in moisture-free condition.

18 Claims, 10 Drawing Sheets

METHOD AND APPARATUS FOR COOLING SEMICONDUCTOR CHIPS

FIELD

The present document discloses information related to a method and apparatus for cooling semiconductor chips as used in, for example, computers, digital processors, or the like.

BACKGROUND

Semiconductor chips are used in a variety of electronic devices, such as, for example, computer equipment, where they can be employed as CPUs or video processors. The chips generate heat during operation, which can adversely affect performance of the chips.

International Patent Application Publication WO01/25881 A2 (Asetek A/S) describes a computer system incorporating a cooling unit. The cooling unit uses conventional coolant that is being led from a compressor to a heat exchanger being in thermal contact with a component in the computer system generating heat, as example a central processing unit (CPU). The compressor is a low voltage compressor although the computer system has to have high voltage electrical power from the public electricity distribution net. By using a low voltage compressor the demands for power consumption and space may be limited. Also, it is possible to power the compressor from the built-in power supply of the computer system. In a preferred embodiment the heat exchanger being in thermal contact with the processing unit is enclosed in an insulated box. The box has openings for piping leading the coolant to and from the heat exchanger, and the box preferably also has a slot so that connection pins from the printed circuit board of the processing unit can protrude put through the box. Thereby the box can be attached to the motherboard by means of the connection pins. An alternative box has an orifice intended for abutting a base plate of the processing unit and has biasing means for holding the box onto a socket for the base plate and in abutment with the base plate.

Asetek Inc. markets a product called Vapochill™, promising vapor phase CPU cooling. The cooling system is, according to the advertising literature, based on use of a compressor to remove heat dissipated from a CPU. The vapor compression cycle is advertised to make the heat removal 10 times more efficient than water cooling and 50 times more efficient than air cooling.

U.S. Pat. No. 5,574,627 (Porter) describes resistive ink elements that are applied to the exposed surfaces of thin sections of thermal insulation provided to cool integrated circuit devices within a computer system. The insulation is made thinner than required to prevent the formation of condensation upon the exposed surfaces of the insulation in order to accommodate space limitations within the computer system. The resistive ink elements generate heat upon the application of an electrical current thereto to warm the exposed surfaces of the insulation to a temperature above the dew point of the ambient environment within the computer system, thereby preventing the formation of condensation on the surfaces of the insulation.

European Pat. App. No. 0489326 A2 (Hitachi Ltd.) describes an electronic computer cooling system having a cooling apparatus to cool an electronic computer and cooling members for thermally connecting semiconductor devices whose operating speeds are raised by cooling to a low temperature source of the cooling apparatus. Circuit boards onto which the semiconductor devices and the like constructing the electronic computer are mounted and the cooling apparatus such as a refrigerating apparatus and the like are compactly enclosed in a single casing. Or, the circuit boards and the cooling apparatus are compactly enclosed in separate detachable casings, respectively. Thus, a structure in which desired semiconductor devices can be certainly cooled by using the cooling members is obtained.

SUMMARY

The following summary is intended to introduce the reader to this specification but not to define any invention. In general, this specification discusses one or more methods or apparatuses for cooling a heat-generating chip, such as processing chips used in computer equipment.

According to one aspect, a cooling apparatus for cooling a heat-generating chip mounted in a standard receptacle on a circuit board is provided, particularly where the standard receptacle includes a socket with chip connection terminals and a cradle with a standard heat-sink connection structure. The cooling apparatus includes an evaporator having a thermally conductive front face, a compressor in fluid communication with the evaporator for delivering refrigerant thereto, and an evaporator coupling for coupling the evaporator to the heat-generating chip with the front face adjacent thereto. The coupling includes a housing, a first retaining structure for holding the evaporator in the housing, and a second retaining structure for attaching the housing to the standard heat-sink connection structure.

The housing can have a leading face for insertion into the cradle and a rear face opposite the leading face, the front face of the evaporator extending proud of the leading face of the housing by an amount defining a front face offset. The second retaining structure can include a cradle insulation pack disposed generally between the housing and the cradle for maintaining the receptacle in moisture free condition. The cradle insulation pack can include a first gasket having a first evaporator aperture therein for receiving the evaporator in snug fit. The first gasket can have a thickness that is greater than front face offset. The cradle insulation pack can include a second gasket having a socket aperture therein for receiving the socket in snug fit. The first and second gaskets can include closed cell neoprene material. The second retaining structure can include at least one spring clip having a transverse strap extending across the rear face of the housing, and a pair of legs extending forwardly of the strap, the legs having barbs at leading ends thereof for insertion into retaining apertures provided in the cradle. The strap can have an inwardly protruding central portion for exerting a resilient compressive force on the housing and urging the evaporator against the chip.

The first retaining structure can include a retaining wall joined to the housing and extending across the rear face thereof. The first retaining structure can include a first keeper disposed within the housing, between a rear face of the evaporator and the retaining wall, the first keeper having a conduit aperture therein through which a conduit extends, the conduit providing fluid communication between the evaporator and the compressor. The first retaining structure can include a second keeper disposed within the housing, the second keeper having a second evaporator aperture therein for receiving the evaporator in snug fit. The first and second keepers can include a closed cell polyethylene foam material.

The evaporator can include a casing defining an interior chamber therein, the casing including sidewalls extending from the front face and a rear wall opposite the front face. The rear wall of the casing can be provided with an inlet aperture for admitting liquid refrigerant from the compressor into the chamber, and an outlet aperture for evacuating vapourized refrigerant from the chamber. The apparatus can include a nozzle in flow communication with the inlet port and extending from the rear wall of the casing to a nozzle end positioned within the chamber, intermediate the front face and the rear wall.

The apparatus can include a conduit extending between the evaporator and the compressor, the conduit including a delivery line for delivering liquid refrigerant to the evaporator, and a return line for returning vapour refrigerant from the evaporator to the compressor, the delivery and return lines being spatially separated from each other. The delivery line can be of dual walled construction, having a ribbed inner core disposed within a braided sheath.

Other aspects and features of the present specification will become apparent, to those ordinarily skilled in the art, upon review of the following description of the specific examples of the specification.

BRIEF DESCRIPTION OF THE DRAWINGS

The drawings included herewith are for illustrating various examples of articles, methods, and apparatuses of the present specification and are not intended to limit the scope of what is taught in any way. In the drawings.

DETAILED DESCRIPTION

Various apparatuses or processes will be described below to provide an example of an embodiment of each claimed invention. No embodiment described below limits any claimed invention and any claimed invention may cover processes or apparatuses that are not described below. The claimed inventions are not limited to apparatuses or processes having all of the features of any one apparatus or process described below or to features common to multiple or all of the apparatuses described below. It is possible that an apparatus or process described below is not an embodiment of any claimed invention. The applicants, inventors or owners reserve all rights that they may have in any invention disclosed in an apparatus or process described below that is not claimed in this document, for example the right to claim such an invention in a continuing application and do not intend to abandon, disclaim or dedicate to the public any such invention by its disclosure in this document.

Figure 1:
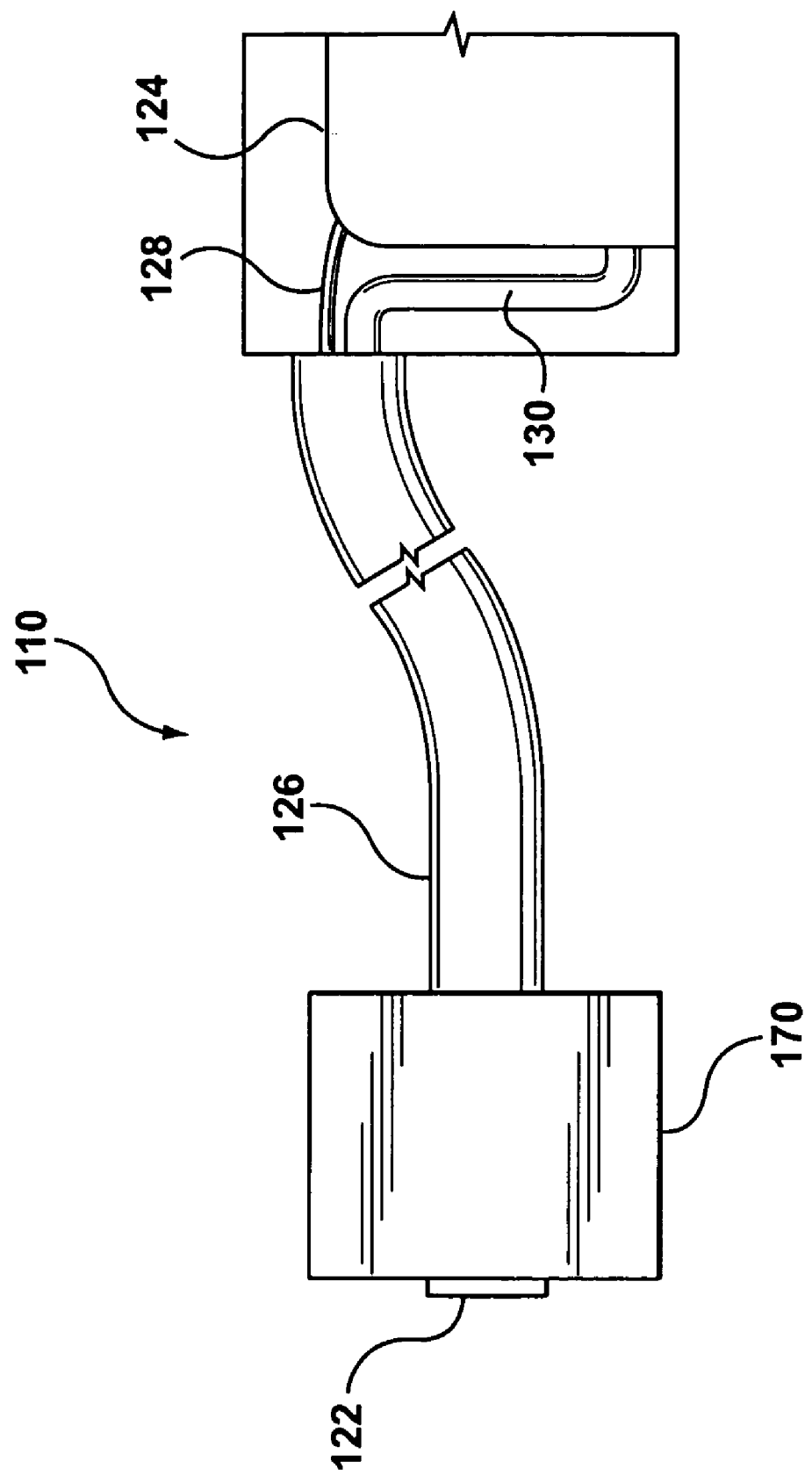
FIG. 1 is a schematic view of an example of a chip cooling apparatus.
Figure 2:
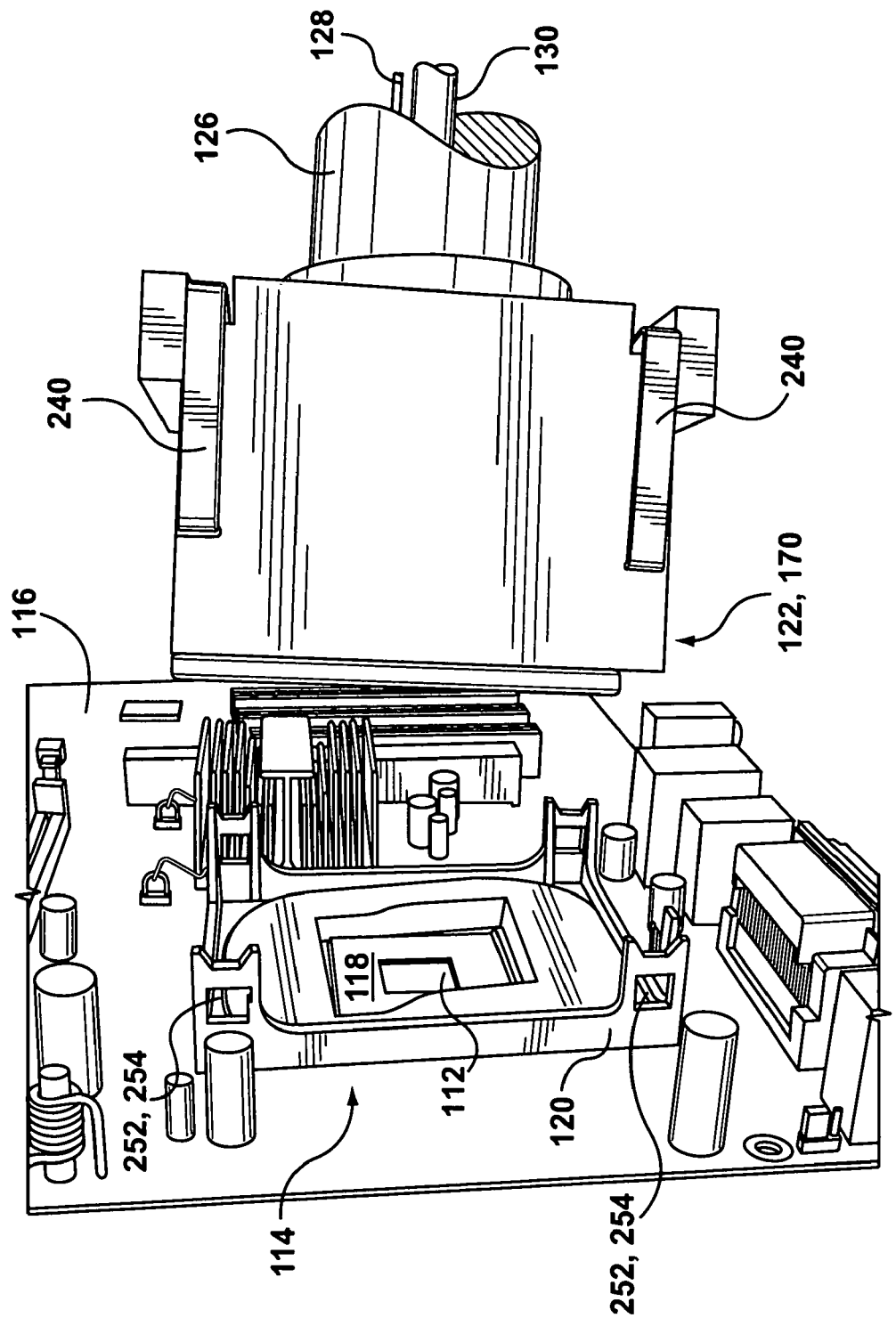
FIG. 2 is a perspective view of a portion of the apparatus of FIG. 1 shown in alignment with, but separated from, a chip to which the apparatus can be coupled.

Referring to FIGS. 1 and 2, a cooling apparatus 110 is shown as an example of an aspect of the teaching disclosed herein. The cooling apparatus 110 is adapted for use with a heat-generating chip 112 such as, for example, a CPU or video processing chip of a computer. The chip 112 is mounted in a standard chip-receiving receptacle 114 mounted on a circuit board 116. The receptacle 114 includes a chip socket 118 to provide electrical communication with the chip 112, and a cradle 120 for connection to a heat sink (not shown). The socket 118 and cradle 120 are of "industry standard" size and/or configuration. In the example illustrated, the socket 118 and cradle 120 are configured for an Intel™ brand chipset.

The cooling apparatus 110 is adapted to remove heat from the chip 112. The apparatus 110 includes an evaporator 122, a compressor 124, and a conduit 126 connecting the evaporator 122 to the compressor 124.

The conduit 126 includes a delivery line 128 for delivery of refrigerant in liquid phase to the evaporator 122. The conduit 126 also includes a return line 130 for conveying refrigerant in vapour phase from the evaporator 122 back to the compressor 124.

Figure 3:
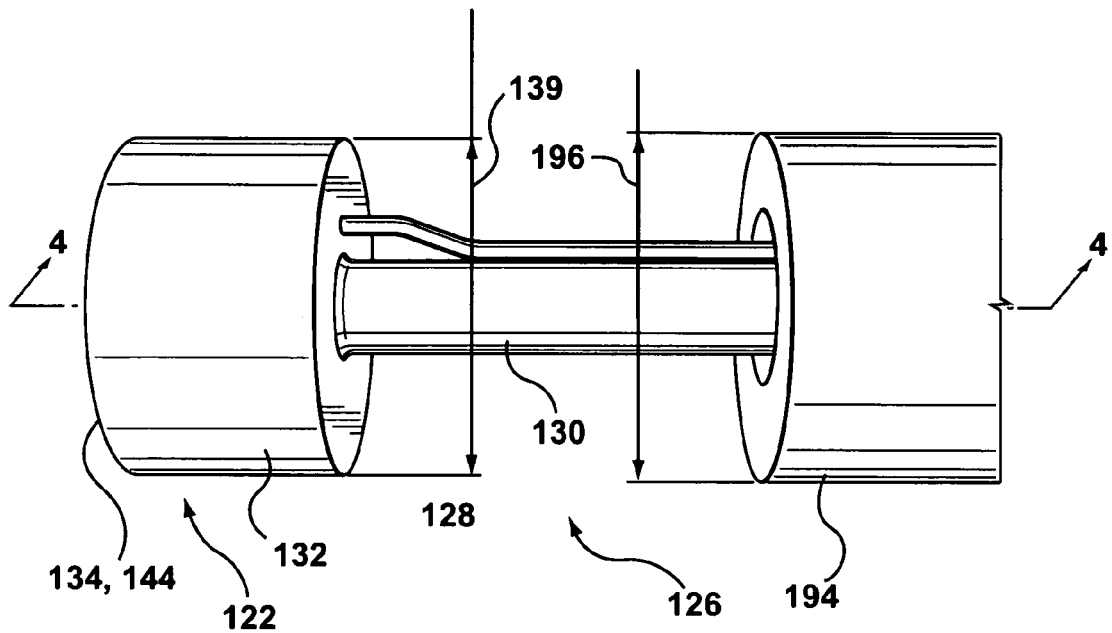
FIG. 3 is an enlarged side view of a portion of the apparatus of FIG. 1.
Figure 4:
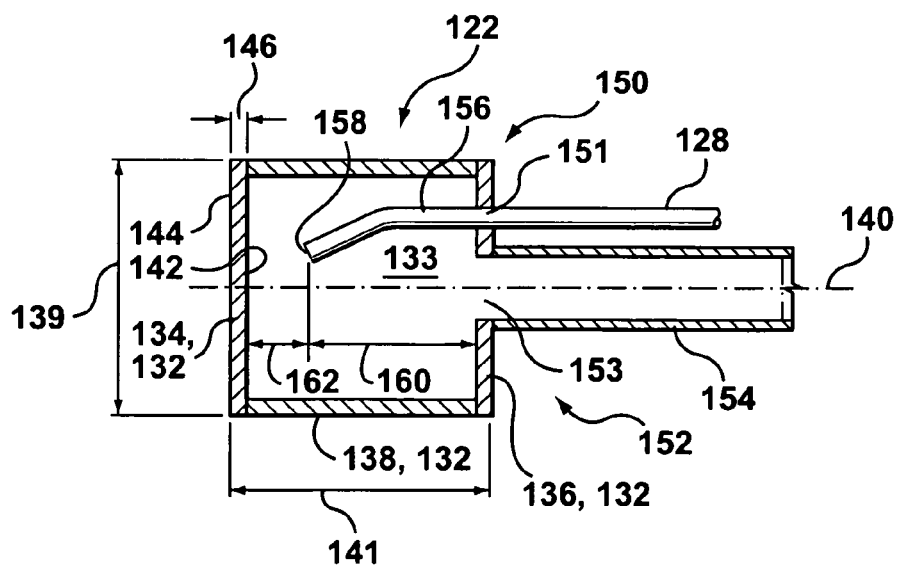
FIG. 4 is a cross-sectional view of the apparatus of FIG. 3 taken along the lines 4-4.

As best seen in FIGS. 3 and 4, the evaporator 122 has a casing 132 defining an interior chamber 133 in which liquid refrigerant supplied by the compressor 124 can change phase to vapour. The casing 132 is, in the example illustrated, cylindrical in shape, and includes a thermally conductive front plate 134, a rear plate 136, and casing sidewalls 138 extending between the front and rear plates 134, 136. The casing 132 defines an evaporator axis 140 extending coaxially with the cylindrical sidewall 138, and normal to the front and rear plates 134, 136. The casing 132 defines an outer diameter 139 and length 141 of the evaporator 122. In the example illustrated, the outer diameter 139 is about 41 to 41.5 mm, and the length 141 is about 25 to 26 mm.

In the example illustrated, the front plate 134 is generally disc-shaped, and has an interior face 142 directed towards the interior chamber 134, and an exterior face (also called a contact face) 144 opposite the interior face 142. The front plate 134 has a thickness 146 extending between the interior face 142 and the contact face 144.

In use, the evaporator 132 is adapted to be positioned adjacent the chip 112, with the contact face 144 bearing against (or otherwise in thermal communication with) the chip 112. The phase change of the refrigerant with the chamber 133 is endothermic, absorbing heat from the environment. The front plate 134 is of a thermally conductive material, so that heat from the chip 112 can readily transfer through the front plate 134, to be absorbed by the phase-changing refrigerant and carried away to the compressor 124. The front plate 134 is, in the example illustrated, made of copper material, and has a thickness 146 of about 2 to 3 mm.

The casing 132 is provided with an inlet port 150 and an outlet port 152 for respective connection with the delivery and return lines 128, 130, to receive and evacuate refrigerant into and from the chamber 133. In the example illustrated, the ports 150 and 152 are provided in the rear plate 136 of the casing 132.

The outlet port 152 can include an outlet aperture 153 in the rear plate 136, and a tubular stem 154 extending therefrom, away from the chamber 133. The outlet aperture 153 can be coaxially positioned with respect to the evaporator axis 140, like the stem 154 joined to the rear plate 136. The stem 154 can serve as a nipple for attachment to the return line 130, providing leak-proof flow between the chamber 133 and the return line 130.

The inlet port 150 can include an inlet aperture 151 in the rear plate 136 and an injection nozzle 156 extending interiorly of the chamber 133, from the inlet aperture 151 towards the front plate 134. In the example illustrated, the injection nozzle 156 terminates at a dispensing end 158 that is spaced axially forward of the rear plate 136 (and hence forward of the outlet port 152) by a dispensing offset 160, and that is spaced axially rearward (or away from) the front plate 134 by a dispersion gap 162. The dispensing offset 160 can help to ensure that the refrigerant supplied to the chamber 133 has time to absorb heat before being evacuated through the outlet port 152 (i.e. prevent a "short circuit" flow between the inlet and outlet ports 150, 152). The dispersion gap 162 can help to maximize transfer of heat away from the front plate 134 by optimizing the distribution of liquid refrigerant over the surface of the interior face 142. In the example illustrated, the dispensing offset 160 is about 11 to 12 mm, and the dispersion gap 162 is about 9 to 10 mm.

Furthermore, the injection nozzle 156 can be inclined relative to the evaporator axis 140 to further enhance distribution of the refrigerant in the chamber 133. In the example illustrated, the inlet and outlet ports 150, 152 have distinct inlet and outlet apertures 151, 153 extending through the casing 132. The outlet aperture 153 is centrally (coaxially) located in the rear plate 136.

The inlet aperture 151 is radially offset from the outlet aperture 153. The nozzle 156 is inclined relative to the axis 140 so that refrigerant dispensed therefrom is directed to a central (rather than a corresponding radially offset) point on the interior surface 142 of the front plate 134.

The size of the inlet and out ports 150, 152 (i.e. the respective flow conveying cross-sectional areas thereof can be tuned with respect to each other and the size of the chamber 133 to optimize the performance of the evaporator 122. In the example illustrated, the inlet port 150 has a flow diameter of about 0.5 to 1.0 mm, and the outlet port 152 has a flow diameter of about 10.5 to 11.5 mm.

The evaporator 122 can generally be constructed for reliable, leak proof operation. In the example illustrated, the casing 132 is of metal material, and more particularly of copper. The stem 154 is of rigid copper tubing. The injection nozzle 156 is, in the example illustrated, provided by a leading portion of the delivery line 128 extending through the inlet aperture 151.

Figure 5:
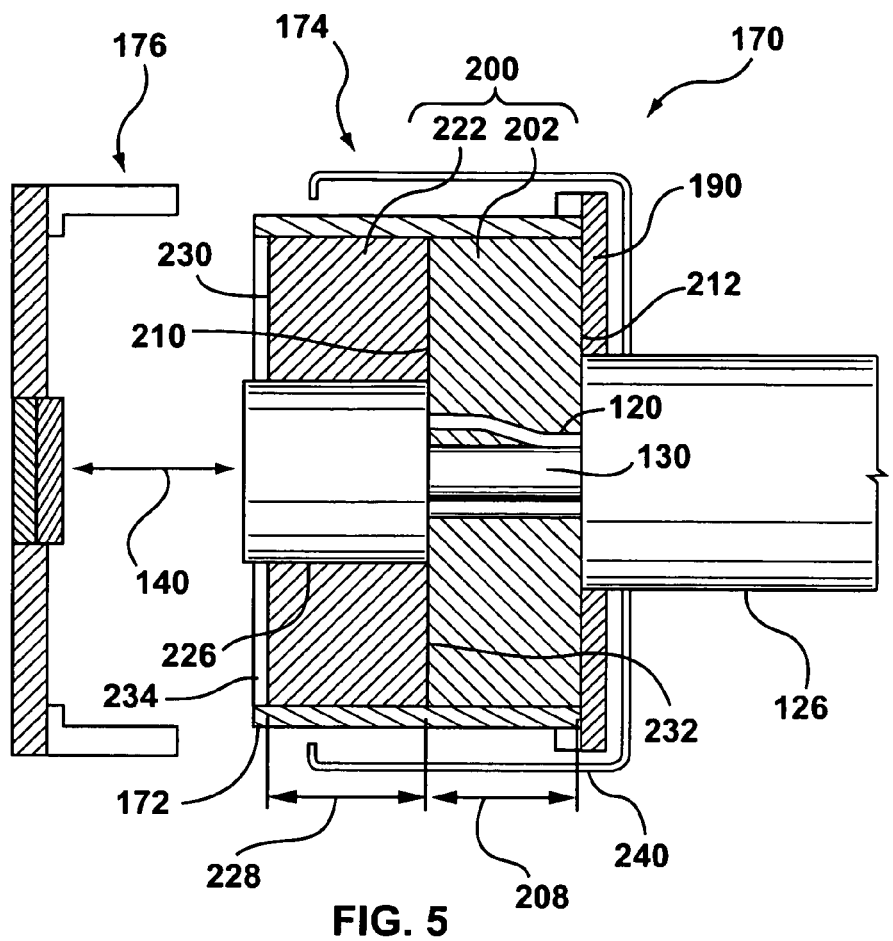
FIG. 5 is a side view in cross-section of the apparatus shown in FIG. 2.
Figure 6:
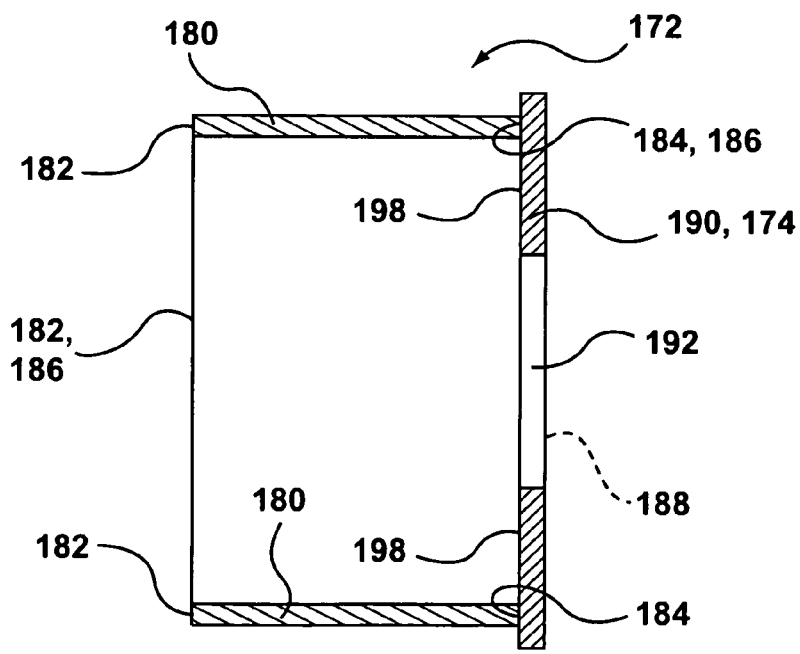
FIG. 6 is a detailed view of a coupling element of FIG. 5.
Figure 7:
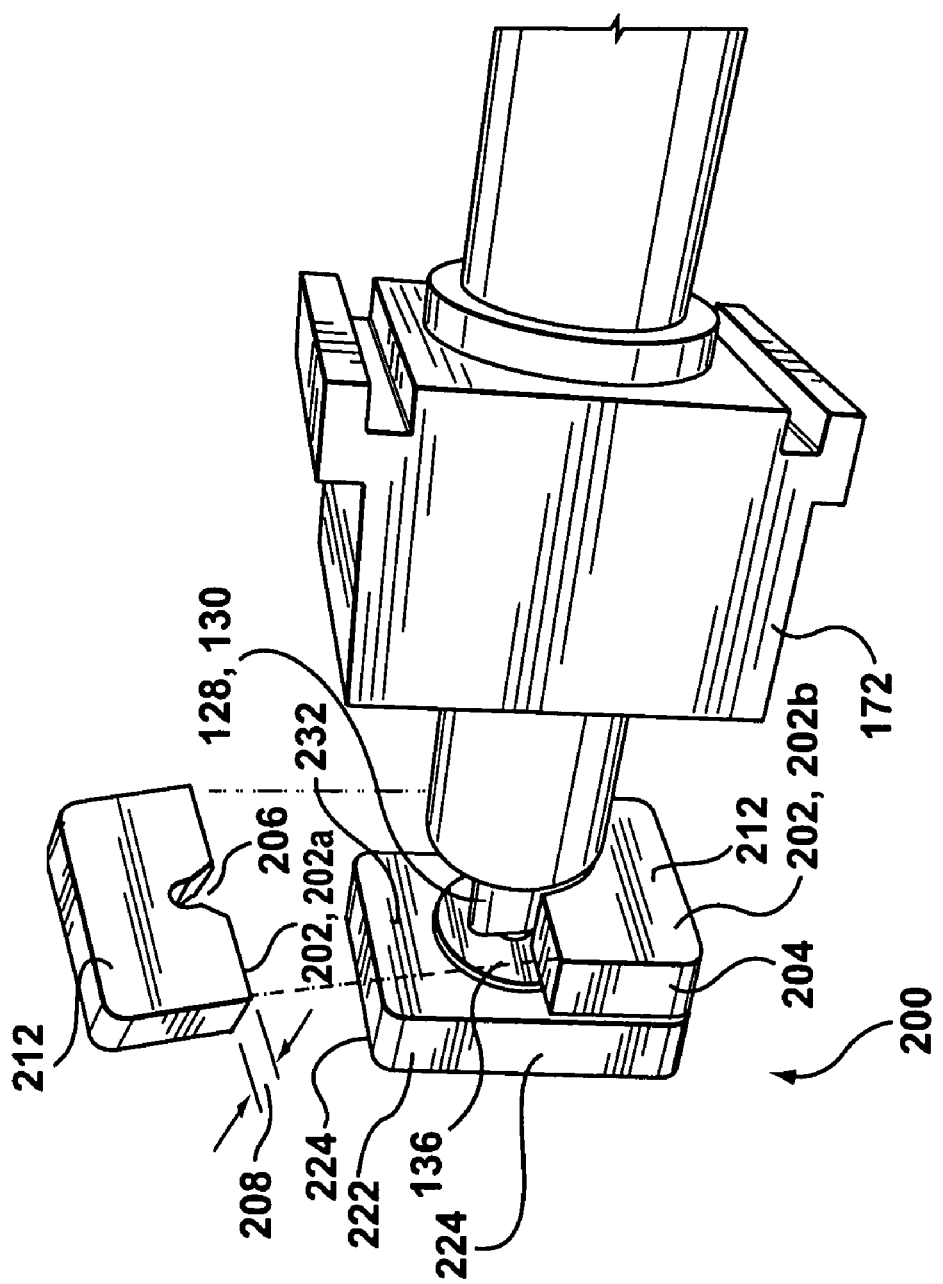
FIG. 7 is an exploded perspective view of a portion of the apparatus of FIG. 1.

Referring now to FIGS. 5 and 6, the apparatus 110 is provided with an evaporator coupling 170 for coupling the evaporator 122 to the chip 112. The coupling 170 includes a housing 172, a first retaining structure 174 for holding the evaporator 122 in the housing 172, and a second retaining structure 176 for attaching the housing 172 to the receptacle 114.

The housing 172 includes housing sidewalls 180 that extend generally parallel to the axial direction defined by the axis 140. In the example illustrated, the housing 172 is of generally rectangular shape in cross-section (i.e. in a plane normal to the axis 140), and has four sidewalls 180 joined together at axially extending side edges thereof. Each housing sidewall 180 extends longitudinally (parallel to the axis 140) between a transverse front edge 182 and a rear edge 184 opposite the front edge 182. The front edges 182 are generally coplanar, define a front housing face 186 of the housing 172. The housing 172 has a rear housing face 188 opposite the front housing face 186.

The first retaining structure 174 includes, in the example illustrated, a retaining wall 190 extending across the rear housing face 188. The retaining wall 190 can abut the rear edges 184 of the sidewalls 180, and in the example illustrated, are integral therewith.

The retaining wall 190 is provided with a conduit aperture 192 through which the conduit 126 can pass. As seen in FIG. 3, in the example illustrated, the conduit 126 includes an insulating sheath 194 encasing the delivery and return lines 128, 130. The insulating sheath 194 can have an outer diameter 196 that is greater than the outer diameter 139 of the evaporator 122, so that the evaporator 122 and conduit 126 can pass through the conduit aperture 192 in the retaining wall 190.

The surface of the retaining wall 190 adjacent the aperture 192 and directed towards the front housing face 186 defines an abutment surface 198 of the first retaining structure 174. The first retaining structure 174 further includes a housing insulation pack 200 disposed in the housing 172 and adapted to bear against the abutment surface 198.

In the example illustrated, the housing insulation pack 200 includes a first keeper 202 for preventing withdrawal of the evaporator 122 from inside the housing 172 out through the aperture 192. The first keeper 202 is sized to fit within the housing, having side surfaces 204 in snug engagement with the sidewalls 180 of the housing 172. The first keeper 202 has an internal aperture 206 through which the delivery and return lines 128, 130 can pass, and a thickness 208 extending forward and rearward faces 210, 212, respectively. The internal aperture 206 is sized smaller than the outer diameter 196 of the evaporator 122, so that a least a portion of the rear plate 136 of the evaporator 122 bears against a portion of the forward face 210 of the first keeper 202, and at least a portion of the rearward face 212 of the first keeper 202 bears against the abutment surface 198.

To facilitate assembly of the evaporator 122 and keeper 202 in the housing 172, the first keeper 202 can have a slot extending from a side surface 204 to the internal aperture 206, so that the first keeper 202 can be pressed over the delivery and return lines 128, 130 by sliding them transversely through the slot. Alternatively, and as shown in the illustrated example, the first keeper 202 can be provided in two keeper halves 202*a* and 202*b*, respectively. Each half 202*a*, 202*b* can be assembled behind the evaporator 122 on opposing sides of the delivery and return lines 128, 130, and then fed into the housing 172.

The housing insulation pack 200 further includes, in the example illustrated, a second keeper 222 having respective side surfaces 224, a second internal aperture 226, and a thickness 228 extending between forward and rearward surfaces 230, 232, respectively. The second internal aperture 226 of the second keeper 222 is sized to fit snugly around the outer diameter 139 of the evaporator casing 132. The transverse extent of the second keeper 222 is sized to fit within the housing 172, with the side surfaces 224 in snug engagement with the sidewalls 180.

The respective axial extents or thicknesses 208, 228 of the first and second keepers 202, 222 can be sized relative to each other and the axial length of the housing sidewalls 180 so that the contact face 144 of the evaporator 122 is positioned axially forward, or proud of, the front face 186 of the housing 172. The forward surface 230 of the second keeper 222 can be axially rearward, or shy of, the front face 186 of the housing 172. This relative positioning can help to ensure that the contact 144 satisfactorily bears against the chip 112 when the evaporator 122 is coupled thereto, and can provide a gasket pocket 234 extending axially forward of the forward face 210 of the second keeper 222, and transversely between forwardly projecting portions of the casing 132 and housing sidewalls 180. The gasket pocket 234 can receive portions of the second retaining structure 176, as described in greater detail hereinafter.

The housing insulation pack 200 thus helps to hold the evaporator 122 in position within the housing 172, and helps to insulate the evaporator 122 from the ambient environment. This insulating function is desirable, because without adequate insulation, the low temperature evaporator 122 could lead to the formation of moisture on the outer surfaces of the housing 172 as a result of, for example, condensation of vapour in the surrounding air. Such moisture poses a risk of fouling the electronic connections and circuitry of the chip 112 and circuits in which it is connected. The transverse spacing between the casing sidewalls 138 and housing sidewalls 180, and the axial spacing between the casing rear plate 136 and the housing retaining wall 190 are of sufficient size to ensure that, for the insulating material used, the outer surfaces of the housing 172 remain at a temperature above the dew point of ambient environment, thus avoiding the formation of condensation thereon.

To facilitate the holding/positioning and insulation functions of the housing insulation pack 200, the first and second keepers 202, 222 can be of a relatively strong, tough, air-retaining material, such as a high density cross-linked closed-cell foam material. In the example illustrated, the keepers 202, 222 are of Plastazote™ brand polyethylene foam, having a density of about 6 pcf (about 96 kg/m³), and an ability to withstand temperatures anywhere in a range from −95 to +250 deg. F. (about −70 to +121 deg. C.), without deformation or embrittlement. Such a foam material provides a high insulation value and has a relatively high strength and toughness. The foam material also has a relatively fine internal "grain" structure, which can greatly facilitate accurate and precise sizing of the keepers 202, 222 (whether by cutting, machining, or other forming operations) to provide the desired snug fits with the housing 172 and with the evaporator 122.

Figure 8:
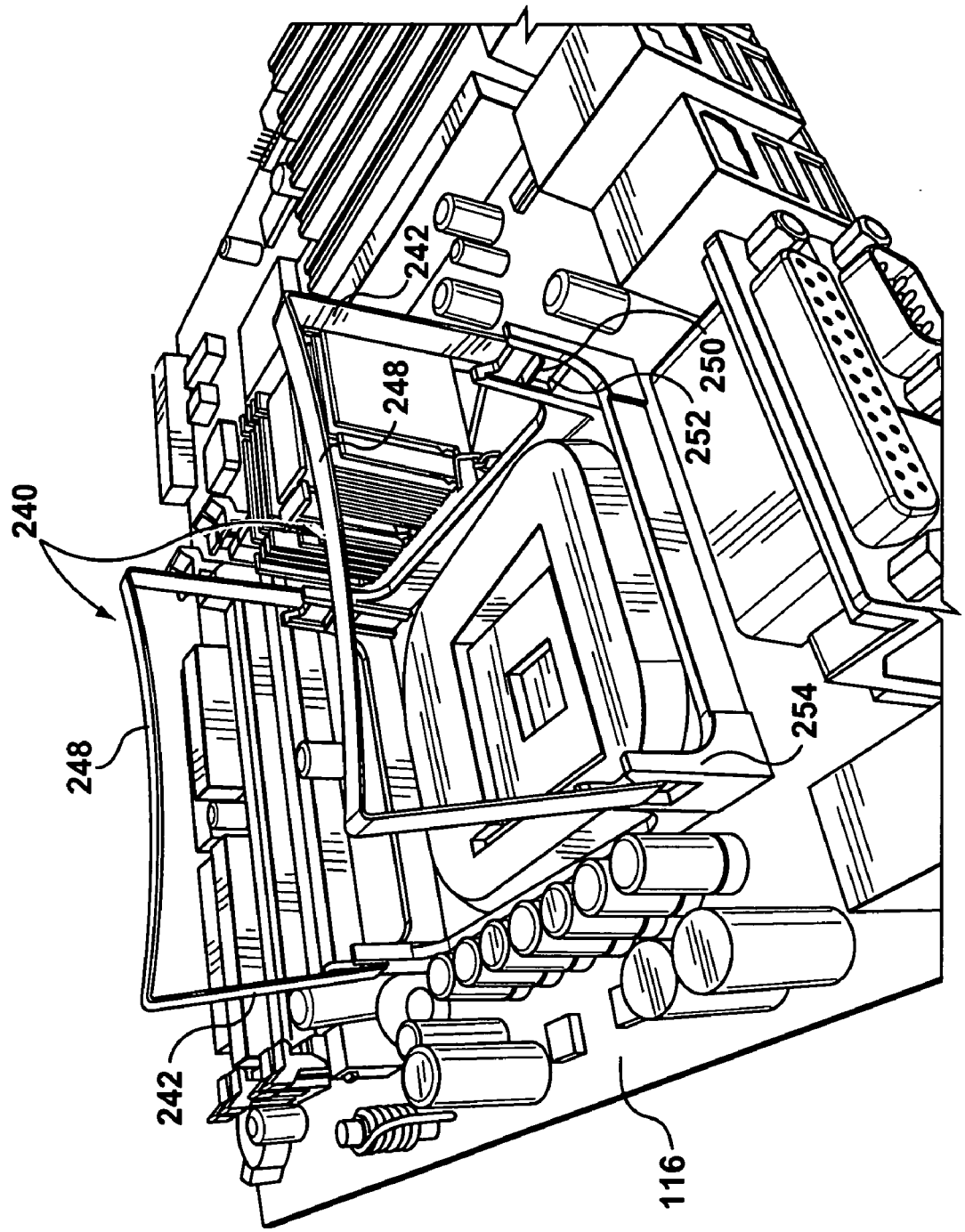
FIG. 8 is a perspective view showing further coupling elements of the apparatus of FIG. 2.
Figure 9:
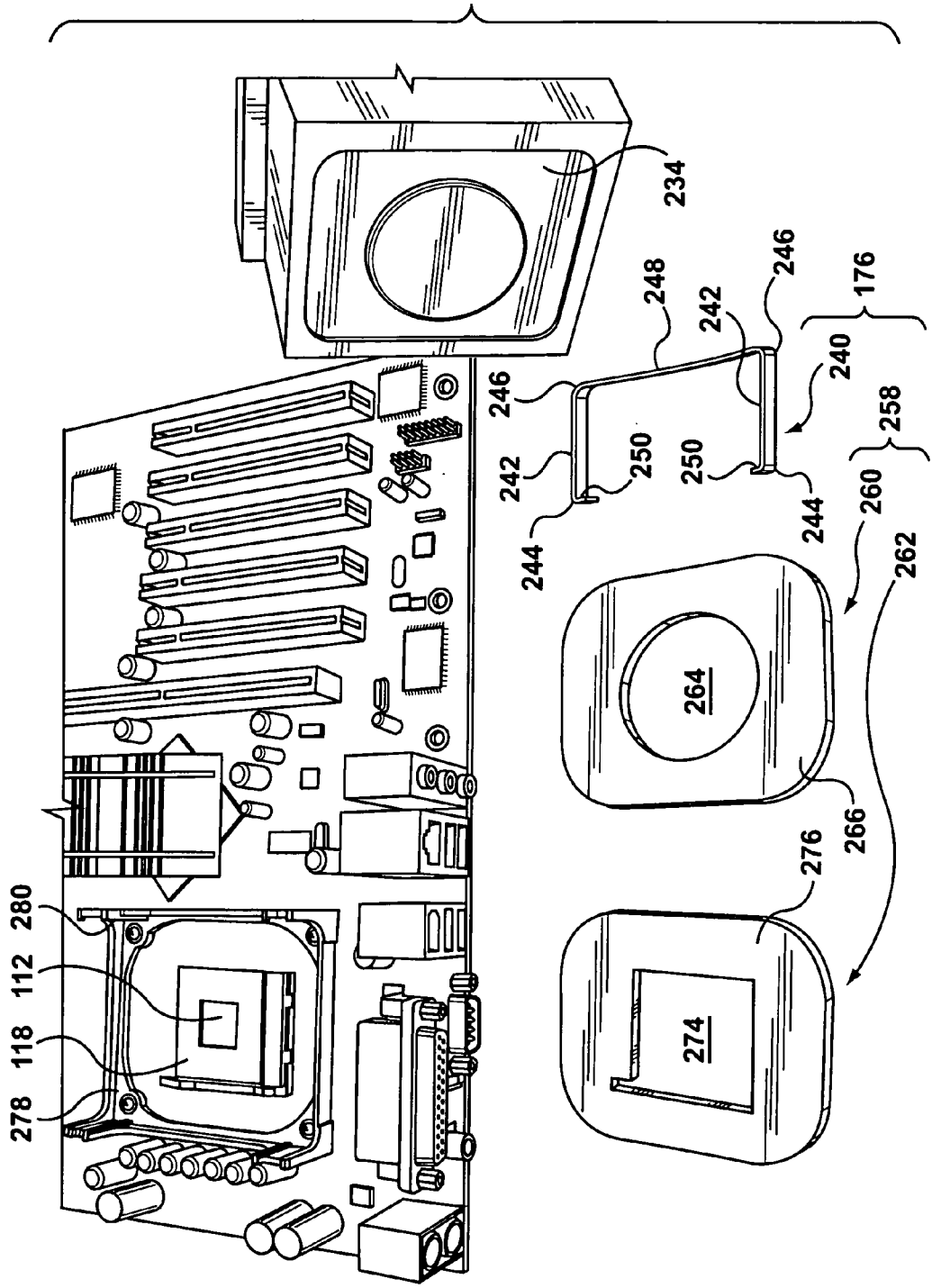
FIG. 9 is an exploded view of the coupling elements of the apparatus of FIG. 1.
Figure 10:
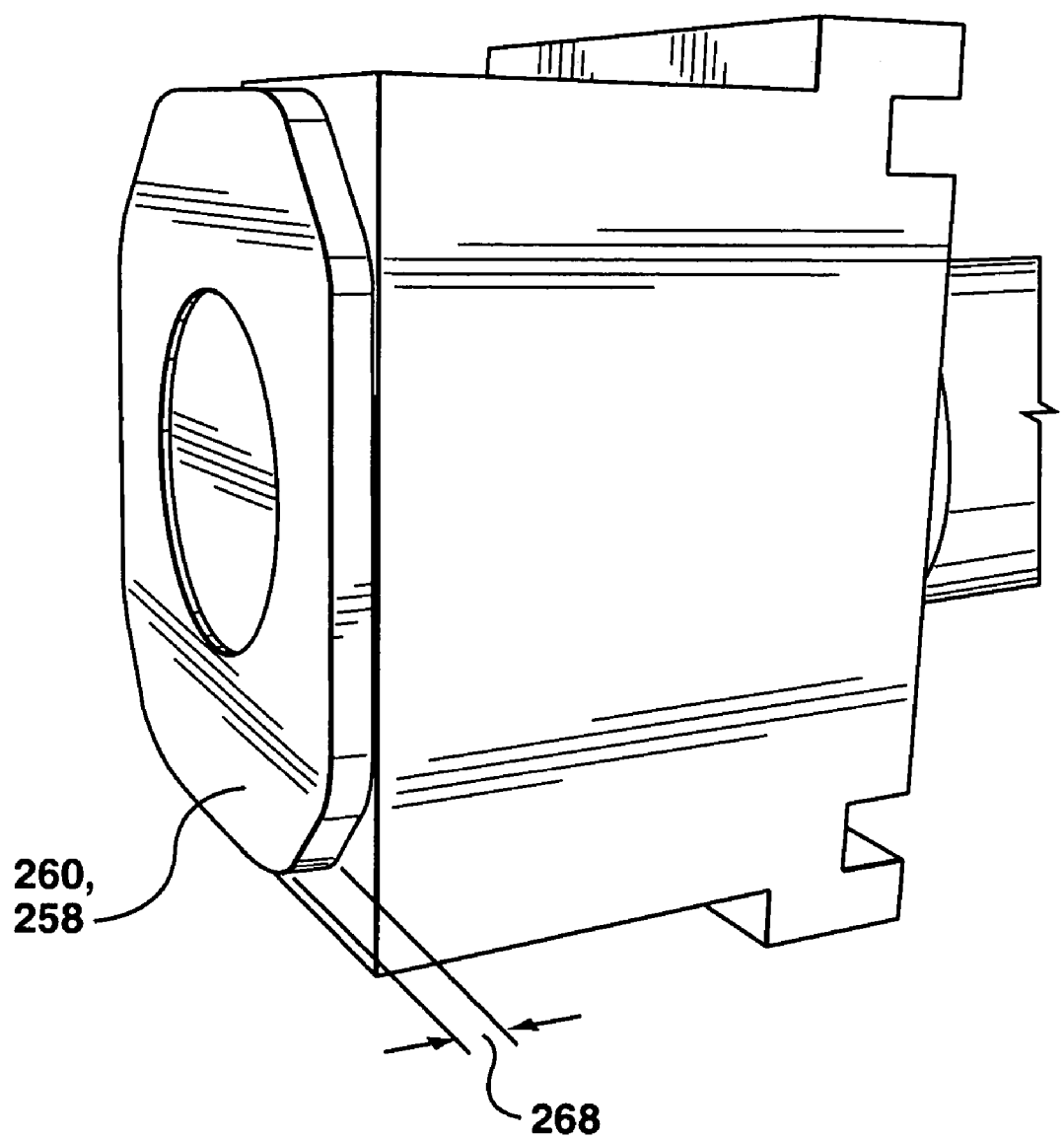
FIG. 10 is a perspective view showing some of the coupling elements of FIG. 9 in an assembled condition.
Figure 11:
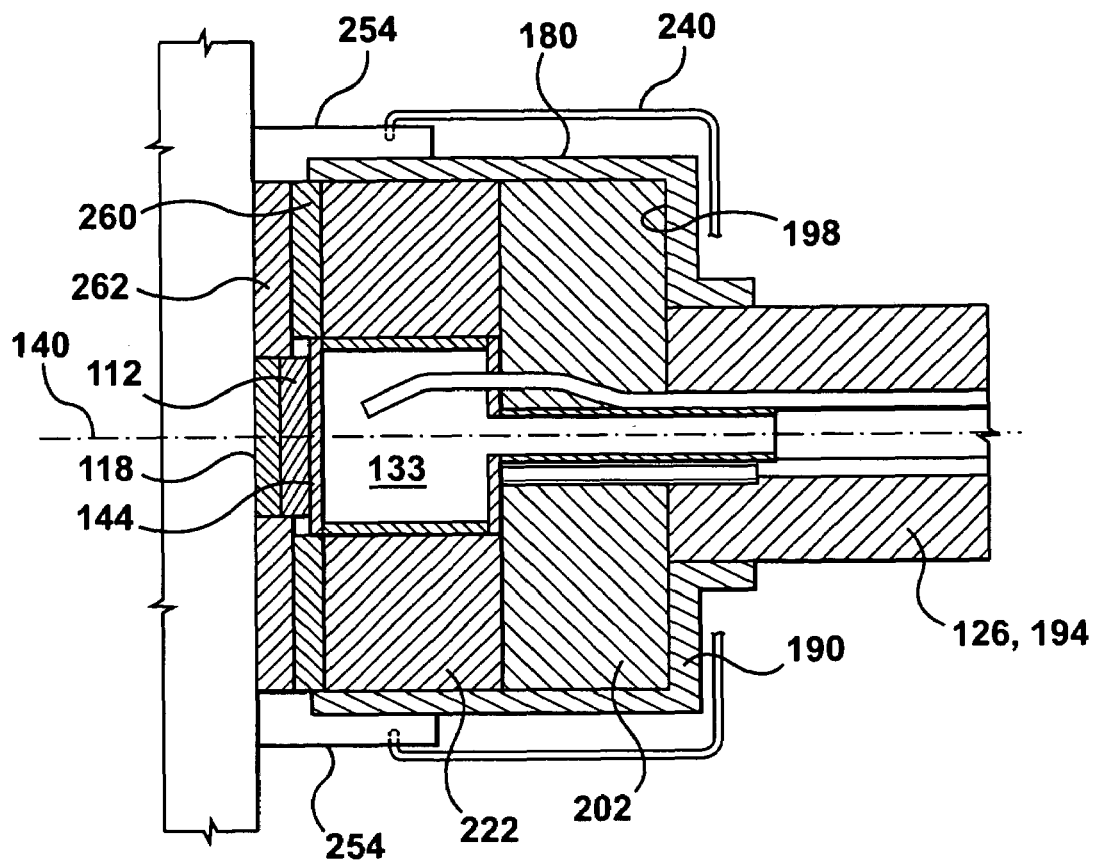
FIG. 11 is a side view in cross-section showing the apparatus of FIG. 2 is an assembled condition.

The second retaining structure 176 is provided for attaching the housing 172 to the receptacle 114. Referring now also to FIGS. 8 and 9, in the example illustrated, the second retaining structure 176 includes a pair of retaining clips 240. Each clip 240 is, in the example illustrated, generally U-shaped, having opposed axially extending arms 242 each having forward and rearward ends 244, 246, and a transverse strap 248 extending between the rearward ends 246. Each clip 240 has transversely inwardly directed barbs 250 located at the forward ends 244 of the arms 242, adapted for insertion in respective apertures 252 provided in uprights 254 extending from the cradle 120.

The second retaining structure 176 further includes a cradle insulation pack 258 to help maintain the receptacle 114 in moisture-free condition. The cradle insulation pack 258 is generally disposed between the evaporator 122 and the receptacle 114, and includes a first gasket 260 and can include a second gasket 262. The first gasket 260 is, in the illustrated example, adapted for placement in the gasket pocket 234.

The first gasket 260 has an aperture 264 sized to fit snugly around the perimeter of the contact face 144, and has an outer perimeter 266 that provides snug engagement with the forward portions of the housing sidewalls 180.

The first gasket 260 is of an insulating, moisture-proof material, such as, for example, closed cell neoprene. In the example illustrated, the gasket 260 is of Durafoam™ brand closed cell neoprene, having a density of about 70-75 kg/m³, and a maximum water absorption by weight of about 5%. The first gasket 260 is resiliently compressible, and has an uncompressed thickness 268 that is greater than the axial offset of the contact face 144, so that the contact face 144 is axially shy of the first gasket front face. In the example illustrated, the uncompressed thickness 268 is about 4.5 to 5.0 mm.

The cradle insulation pack 258, in the example illustrated, further includes a second gasket 262. The second gasket 262 has an aperture 274 sized to fit snugly around the socket 118 of the receptacle 114, and can have a transverse extent equal to that of the first gasket 260. In the example illustrated, the transverse extent of the second gasket 262 is defined by an outer perimeter 276 thereof. The outer perimeter 276 is sized to fit snugly within an inner perimeter 278 of the cradle 120, defining a second gasket pocket 280. The transverse spacing of the sidewalls 180 of the housing 172 thus generally matches the transverse spacing of the inner perimeter 278 of the cradle 120.

The first gasket 260 is, in the example illustrated, of the same material as the first gasket 260, and has an uncompressed thickness 282 that is sufficiently large so that the chip 112 is recessed with respect to the second gasket 262. In the example illustrated, the uncompressed thickness 282 is about 4.5 to 5.0 mm.

To couple the evaporator 122 to the clip 240, the evaporator 122 can be assembled in the housing 172 using the housing insulation pack 200 as described hereinbefore. The first gasket 260 can be positioned in the first gasket pocket 234, and the second gasket 262 can be installed in the second gasket pocket 280 of the receptacle 114. The housing 172 can then be inserted into the cradle 120, the housing 172 being sized to provide a sliding fit between the uprights 254 thereof. Continued axial advancement of the housing 172 into the cradle 120 will eventually lead to engagement of the first gasket 260 with the second gasket. These gaskets 260, 262 can then compress (to respective compressed thicknesses), permitting close, thermally-conductive engagement of the contact face 144 with the chip 112.

Once in position, the clips 240 can be installed over the housing 172, with the barbs 250 engaging the apertures in the uprights 254. The housing 172 can be provided with clip slots that are aligned with the uprights 254, to facilitate positioning the clips 240 relative to the housing 172 and to enhance engagement therewith. The clips 240 are, in the example illustrated, constructed integrally of spring steel strips, bent to provide the U-shape and the barbs 250. The strap portion is, in the example illustrated, provided with a forwardly directed biasing bend, so that a compressible spring force is exerted on the housing 172, urging the contact face 244 against the chip 112 but protecting the chip 112 from excessive force that could cause damage to the chip 112.

Figure 12:
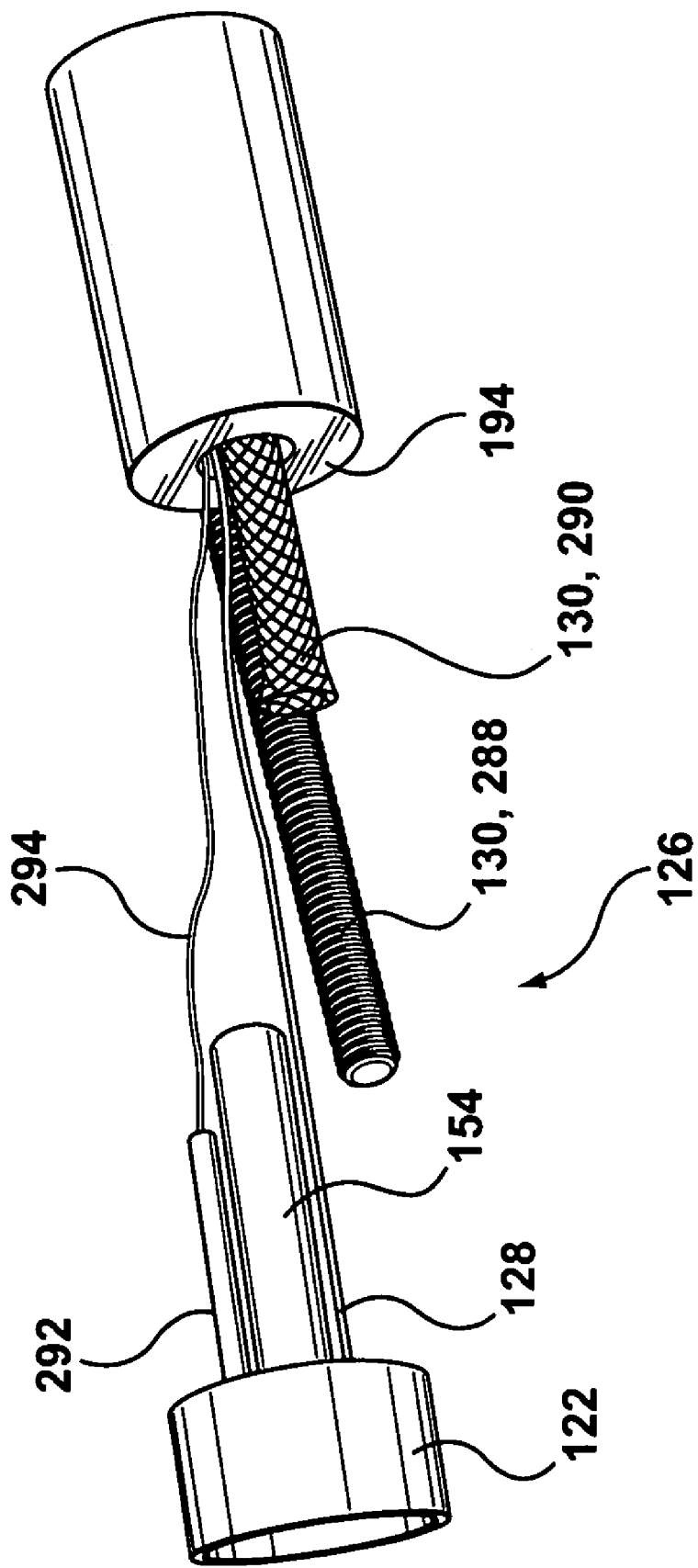
FIG. 12 is an exploded view showing conduit details of the apparatus of FIG. 1.

Referring now to FIG. 12, further details of the conduit 126 can be seen. The conduit 126 includes the delivery line 128 and the return line 130, each of which provide spatially separated, distinct flow lines for the refrigerant. The term "spatially separated" refers to the fact that the delivery line 128 (of smaller diameter for delivering liquid) is not disposed within the larger diameter return line 130, but rather runs beside the return line 130. This can increase performance and reliability of the apparatus 110, since potentially damaging vibration of the delivery line 128 within the return line 130 is avoided. Also, unintended heat transfer effects between the liquid refrigerant and vapour refrigerant flowing through the conduit 126 can be minimized by the spatially separated nature of the lines 128, 130.

The delivery line 128 is of flexible copper tubing, having (in the example illustrated) a diameter of about 2.0 to 2.2 mm. The return line 130 is of dual walled construction, having an inner flexible ribbed stainless steel core 288, and a braided stainless steel cover 290. The braided stainless steel cover 290 can help to improve the durability and flexibility of the return line 130, which in turn can provide greater freedom in relative positioning of the apparatus 110 with respect to a computer (or other equipment) to which the apparatus 110 is to be connected.

The ribbed core 288 of the return line 130 is adapted for insertion partway along the length of the stem 154, and can be soldered therein for assembly. The braided cover 290 slides over the stem 154 along at least a portion of its length. The delivery line 128 can be fed through the hollow center of the sheath 194, alongside the return line 130.

Also shown in FIG. 12 is a temperature sensor 292. The temperature sensor 292 can be positioned to abut the rear plate 136 of the casing 132, to provide an indication of the temperature at which the chip 112 is operating. In the example illustrated, the sensor 292 detects the temperature of the refrigerant exiting the chamber 133, which under steady-state operating conditions is directly correlated to the temperature at which the chip 112 is operating. In the example illustrated, the sensor 292 has a lead wire 294 that extends along the conduit 126. The lead wire 294 can send a signal to a receiver that displays the temperature in a digital read-out.

The sensor 292 can also form part of a simple and reliable control circuit for the apparatus 110. In the example illustrated, the compressor 124 is powered using standard electrical power, such as 110V, 60 Hz AC. Alternative compressors can be used, to provide operation with 12V DC power or 208/240 V AC power sources. The apparatus 110 can include an auxiliary outlet to which a device (e.g. a computer) in which the chip 112 is installed can be connected. As long as the sensor 292 provides a signal corresponding to a sufficiently low operating temperature, the auxiliary outlet can remain powered. If the temperature is above a pre-set value, power can be shut off to the auxiliary outlet, protecting the device from overheating.

Thus according to the present teaching, the apparatus 110 can be free of complicated control systems and software, all of which is typically susceptible to glitches, lock-ups requiring re-boots, incompatibility issues with other software running on a user's system, and ongoing update/version re-installation requirements. With the apparatus 110, no heater element is required adjacent the chip 112 to prevent the formation of moisture (such as condensation), and no extra heater-control systems are required.

For use, the apparatus 110 can be pre-assembled for shipment to a user, the pre-assembly including assembly of the first and second keepers 202, 222 in the housing. The cradle insulation pack and clips can be provided loose. Instructions can be provided with the apparatus 110 as-shipped, instructing a user to remove the standard heat sink (if heat sink is present) from the cradle 120, install the first and second gaskets 260, 262, position the housing in the cradle 120 and secure in place by attaching the clips 240. A thermally-conductive compound can be spread on the contact face 144 of the evaporator, if desired, for facilitating the transfer of heat from the chip 112 to the evaporator. The user can then power up the apparatus 110, and functional cooling of the chip 112 is provided. There is no need to remove the pre-existing standard cradle 120 and to replace it with a custom cradle for coupling to the evaporator. There is also no need to drill holes in the back side of the circuit board, and no need to access the circuit board or any casing in which the circuit board would typically be housed. Also avoided is the need to install a heater element near the chip 112, and to run electrical wires for powering such a heater element. Further, installation of the apparatus 110 is free of the need to install software.

While the above description provides examples of one or more processes or apparatuses, it will be appreciated that other processes or apparatuses may be within the scope of the accompanying claims.

I claim:

1. A cooling apparatus for cooling a heat-generating chip mounted in a standard receptacle on a circuit board, the standard receptacle including a socket with chip connection terminals and a cradle with a standard heat-sink connection structure, the cooling apparatus comprising:
    a) an evaporator having a thermally conductive front face;
    b) a compressor in fluid communication with the evaporator for delivering refrigerant thereto; and
    c) an evaporator coupling for coupling the evaporator to the heat-generating chip with the front face adjacent thereto, the coupling including a housing, a first retaining structure for holding the evaporator in the housing, and a second retaining structure for attaching the housing to the standard heat-sink connection structure.

2. The apparatus of claim 1, wherein the housing has a leading face for insertion into the cradle and a rear face opposite the leading face, the front face of the evaporator extending proud of the leading face of the housing by an amount defining a front face offset.

3. The apparatus of claim 2, wherein the second retaining structure comprises a cradle insulation pack disposed generally between the housing and the cradle for maintaining the receptacle in moisture free condition.

4. The apparatus of claim 3, wherein the cradle insulation pack comprises a first gasket having a first evaporator aperture therein for receiving the evaporator in snug fit.

5. The apparatus of claim 4, wherein the first gasket has a thickness that is greater than front face offset.

6. The apparatus of claim 4, wherein the cradle insulation pack includes second gasket having a socket aperture therein for receiving the socket in snug fit.

7. The apparatus of claim 6, wherein the first and second gaskets comprise closed cell neoprene material.

8. The apparatus of claim 2, wherein the second retaining structure comprises at least one spring clip having a transverse strap extending across the rear face of the housing, and a pair of legs extending forwardly of the strap, the legs having barbs at leading ends thereof for insertion into retaining apertures provided in the cradle.

9. The apparatus of claim 8 wherein the strap has an inwardly protruding central portion for exerting a resilient compressive force on the housing and urging the evaporator against the chip.

10. The apparatus of claim 2, wherein the first retaining structure comprises a retaining wall joined to the housing and extending across the rear face thereof.

11. The apparatus of claim 10 wherein the first retaining structure comprises a first keeper disposed within the housing, between a rear face of the evaporator and the retaining wall, the first keeper having a conduit aperture therein through which a conduit extends, the conduit providing fluid communication between the evaporator and the compressor.

12. The apparatus of claim 11, wherein first retaining structure comprises a second keeper disposed within the housing, the second keeper having a second evaporator aperture therein for receiving the evaporator in snug fit.

13. The apparatus of claim 12, wherein the first and second keepers comprise a closed cell polyethylene foam material.

14. The apparatus of claim 1, wherein evaporator comprises a casing defining an interior chamber therein, the casing including sidewalls extending from the front face and a rear wall opposite the front face.

15. The apparatus of claim 14, wherein the rear wall of the casing is provided with an inlet aperture for admitting liquid refrigerant from the compressor into the chamber, and an outlet aperture for evacuating vapourized refrigerant from the chamber.

16. The apparatus of claim 15, comprising a nozzle in flow communication with the inlet port and extending from the rear wall of the casing to a nozzle end positioned within the chamber, intermediate the front face and the rear wall.

17. The apparatus of claim 1, comprising a conduit extending between the evaporator and the compressor, the conduit including a delivery line for delivering liquid refrigerant to the evaporator, and a return line for returning vapour refrigerant from the evaporator to the compressor, the delivery and return lines being spatially separated from each other.

18. The apparatus of claim 17, wherein the delivery line is of dual walled construction, having a ribbed inner core disposed within a braided sheath.

* * * * *